(12) United States Patent  
Keller

(10) Patent No.: US 7,801,489 B2  
(45) Date of Patent: Sep. 21, 2010

(54) METHOD AND DEVICE FOR MEASURING RADIO INTERFERENCE LEVELS WITH FREQUENCY TRACKING

(75) Inventor: Matthias Keller, Kirchheim (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 1182 days.

(21) Appl. No.: 10/595,569

(22) PCT Filed: Oct. 11, 2004

(86) PCT No.: PCT/EP2004/011352

§ 371 (c)(1), (2), (4) Date: Apr. 27, 2006

(87) PCT Pub. No.: WO2005/047910

PCT Pub. Date: May 26, 2005

(65) Prior Publication Data

US 2008/0274702 A1    Nov. 6, 2008

(30) Foreign Application Priority Data

Oct. 27, 2003   (DE) ................................ 103 50 063

(51) Int. Cl.
*H04B 17/00* (2006.01)
(52) U.S. Cl. ............... 455/67.11; 455/226.1; 455/115.1
(58) Field of Classification Search ... 455/67.11–67.15, 455/226.1–226.3, 115.1–115.4
See application file for complete search history.

(56) References Cited

U.S. PATENT DOCUMENTS

| | | | |
|---|---|---|---|
| 4,859,933 A | 8/1989 | Taylor et al. | |
| 5,119,018 A | 6/1992 | Katayama et al. | |
| 6,268,738 B1 | 7/2001 | Gunthorpe et al. | |
| 6,509,742 B1 * | 1/2003 | Ebizuka et al. | 455/67.13 |
| 7,454,222 B2 * | 11/2008 | Huang et al. | 455/67.11 |
| 7,664,521 B2 * | 2/2010 | Arimitsu | 455/115.1 |
| 2008/0057869 A1 * | 3/2008 | Strong et al. | 455/63.1 |
| 2010/0037124 A1 * | 2/2010 | Hoshi et al. | 455/226.1 |

FOREIGN PATENT DOCUMENTS

| | | |
|---|---|---|
| DD | 283 869 A5 | 10/1990 |
| DE | 2804867 | 8/1979 |
| DE | 3027364 A1 | 2/1982 |

(Continued)

*Primary Examiner*—Lana N Le
(74) *Attorney, Agent, or Firm*—Lewis, Rice & Fingersh, L.C.

(57) ABSTRACT

A method for measuring radio interference levels in a specific frequency range. Said method consists in adjusting the frequency range by means of a pre-measurement; respectively detecting, for each measuring frequency one measuring level of the signal which is to be measured; comparing the measured measuring level to the threshold value, characterized in that when the threshold value of the measuring level is exceeded, the measured level is compared to the respective measuring frequency as a radio interference level; and measuring, in a post-measurement phase, each characterized radio interference level in a more precise manner and in relation to the runtime performance thereof. The average frequency of the measuring frequency range of post-measurement, which is repeated in an alternating cyclic manner in relation to the post-measurement, is tracked in relation to the average frequency of the variable radio interference level which was recently determined in previous pre-measurement, for each characterized radio interference level

11 Claims, 3 Drawing Sheets

FOREIGN PATENT DOCUMENTS

| | | |
|---|---|---|
| DE | 3210144 C2 | 9/1982 |
| DE | 3817499 C1 | 9/1989 |
| DE | 3817500 C1 | 10/1989 |
| DE | 4239741 A1 | 9/1994 |
| DE | 4420448 C1 | 9/1995 |
| EP | 1336855 | 8/2003 |

* cited by examiner

METHOD AND DEVICE FOR MEASURING RADIO INTERFERENCE LEVELS WITH FREQUENCY TRACKING

CROSS REFERENCE TO RELATED APPLICATIONS

This application is a §371 National Phase of PCT/EP2004/011352 filed Oct. 11, 2004 and claims priority to German Patent Application Serial No.: DE10350063.4 filed Oct. 27, 2003.

BACKGROUND

1. Field of the Invention

The invention relates to a method and a device for measuring radio-interference levels.

2. Description of the Related Art

The use of increasingly high transmission frequencies in mobile-telephone technology and increasingly high clock frequencies in data technology is associated with ever more stringent requirements regarding the electromagnetic compatibility (EMC) of electronic devices and systems in these fields. A high-quality EMC measuring technique for accurate and reliable identification and characterisation of electromagnetic interference can be regarded as an essential requirement for an optimised, EMC-compatible design of electronic devices and systems of this kind.

Alongside a high degree of measurement accuracy over a wide bandwidth up to the maximum frequency range, advanced measurement functions, such as signal statistics and measuring power and noise in the time and frequency domains, represent essential specifications for high-quality EMC-measuring technology.

While the principal strength of spectrum analysers in EMC measurement is in rapid frequency measurement up to the maximum frequency range, the practical advantage of measurement receivers can be seen, by contrast, in the high-precision calculation of computation-intensive measurement functions.

The respective strengths of the two devices can be bundled in one system through the systems-technological combination of a spectrum analyser and a measurement receiver in an EMC-measuring station. DE 38 17 500 C1 discloses a system of this kind, wherein the required frequency range is adjusted via a spectrum-analyser function, the measured voltage level is compared at every measuring frequency with a limit value, and the voltage level associated with the measuring frequency is marked as a radio-interference voltage, if the limit value is exceeded by the measured voltage level. As soon as a radio-interference voltage is identified in this manner, the system switches from the spectrum-analyser function to the measurement-receiver function. In the measurement receiver-function, the radio-interference voltage at each measuring frequency is sampled several times with regard to its voltage level and characterised more accurately with regard to its runtime performance by the selected statistical-evaluation function.

Especially in the context of a continuous EMC measurement, the disadvantage with this systems-technological combination of a spectrum analyser with a measurement receiver is the difficulty regarding the dynamic measurement of radio-interference voltages, of which the frequencies change over time. Drifting radio-interference voltages of this kind, as are generated, for example, by primary switched-mode power-supply units, can therefore, under some circumstances drift relatively quickly out of the measuring-frequency range of the measurement receiver and are therefore lost to the measurement receiver with regard to a more accurate analysis of their runtime performance.

SUMMARY

The invention is therefore based upon the object of further developing a method and a device for measuring radio-interference levels in such a manner that radio-interference levels identified in the pre-measurement, which are variable in their frequency, are correctly detected and evaluated in the post-measurement, which follows the pre-measurement.

The object of the invention is achieved by a method and a device for measuring radio-interference levels with the features of claim 1 and claim 5 respectively. Since the mid-frequency of the spectrum analyser is matched, within the framework of the pre-measurement, to the frequency of the respective radio-interference voltage, and this frequency adjustment of the spectrum analyser is adopted by the measurement receiver in the post-measurement, it can be guaranteed that the limited measuring-frequency range of the measurement receiver is tracked to the changed frequency of the respective radio-interference voltage, and that the respectively-identified radio-interference voltage comes to be disposed within the measuring-frequency range of the measurement receiver with regard to a correct runtime analysis.

Advantageous embodiments of the invention are indicated in the dependent claims.

In addition to detecting a frequency drift of the radio-interference voltage correctly, the method according to the invention and the device according to the invention for measuring radio-interference voltages can also correctly identify runtime changes in the voltage level of the radio-interference voltage and take these into consideration correctly in the frequency tracking of the measurement receiver. In this manner, it is possible to provide a correct detection and evaluation of variable-frequency and variable-amplitude radio-interference voltages using the method according to the invention and the device according to the invention for measuring radio-interference voltages.

Several selectable evaluation functions, which allow a more exact analysis of the runtime performance of the radio-interference voltage in the post-measurement over a significantly longer evaluation time by comparison with the measuring runtime of the spectrum analyses, are preferably integrated in the measurement receiver.

The method according to the invention and respectively the device according to the invention for measuring radio-interference voltages is not only designed for a single radio-interference voltage, but, using the spectrum analyser, allows the simultaneous identification of several radio-interference voltages within the framework of a pre-measurement, and, using the measurement receiver, also allows the subsequent evaluation of all identified radio-interference voltages in the post-measurement.

The drawings illustrate a preferred embodiment of the invention, which is described in greater detail below. The drawings are as follows:

DETAILED DESCRIPTION OF THE PREFERRED EMBODIMENT(S)

Figure 1:
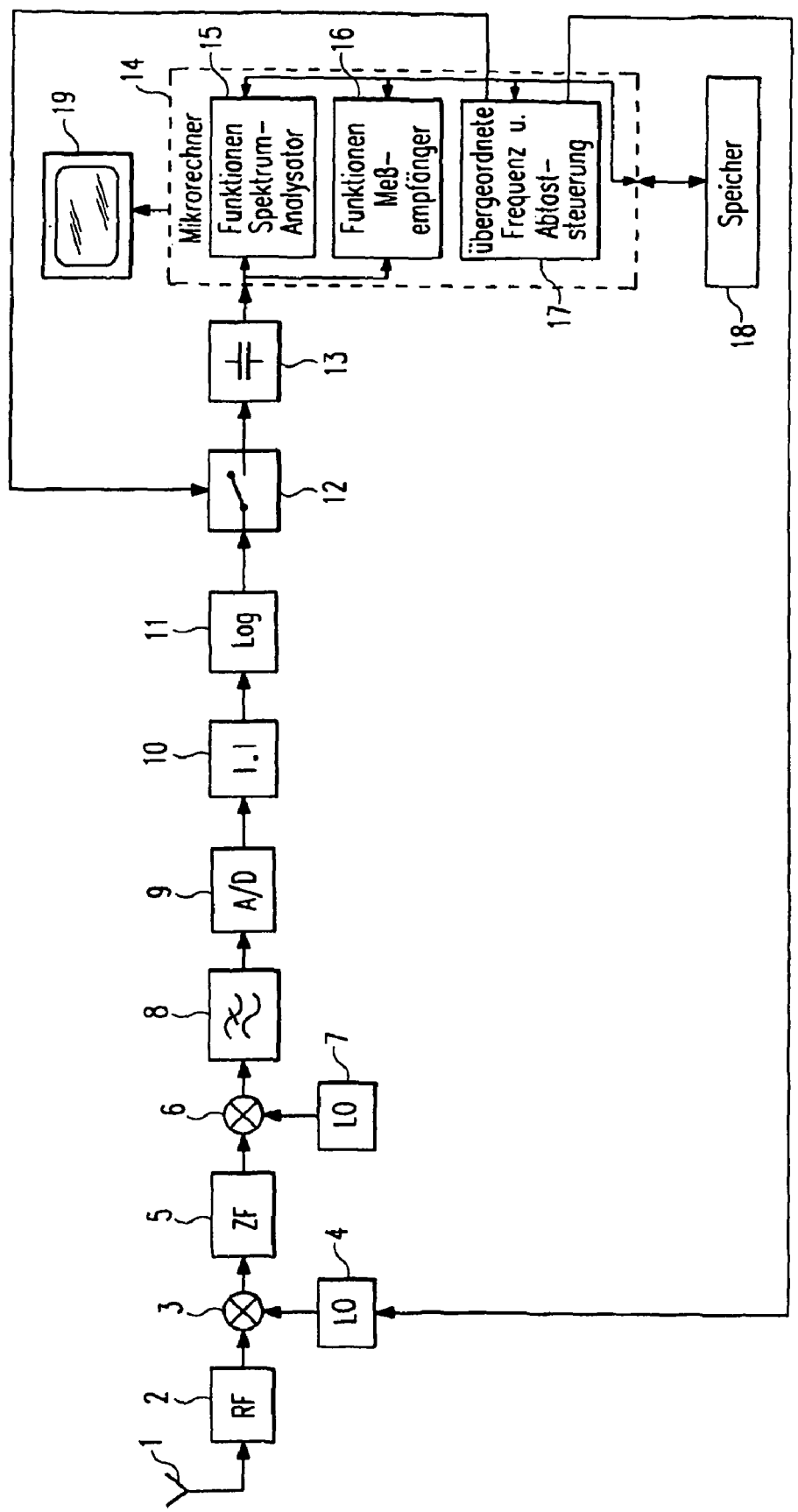
FIG. 1 shows a circuit diagram of an exemplary embodiment of a device according to the invention for measuring radio-interference voltages.
Figure 2:
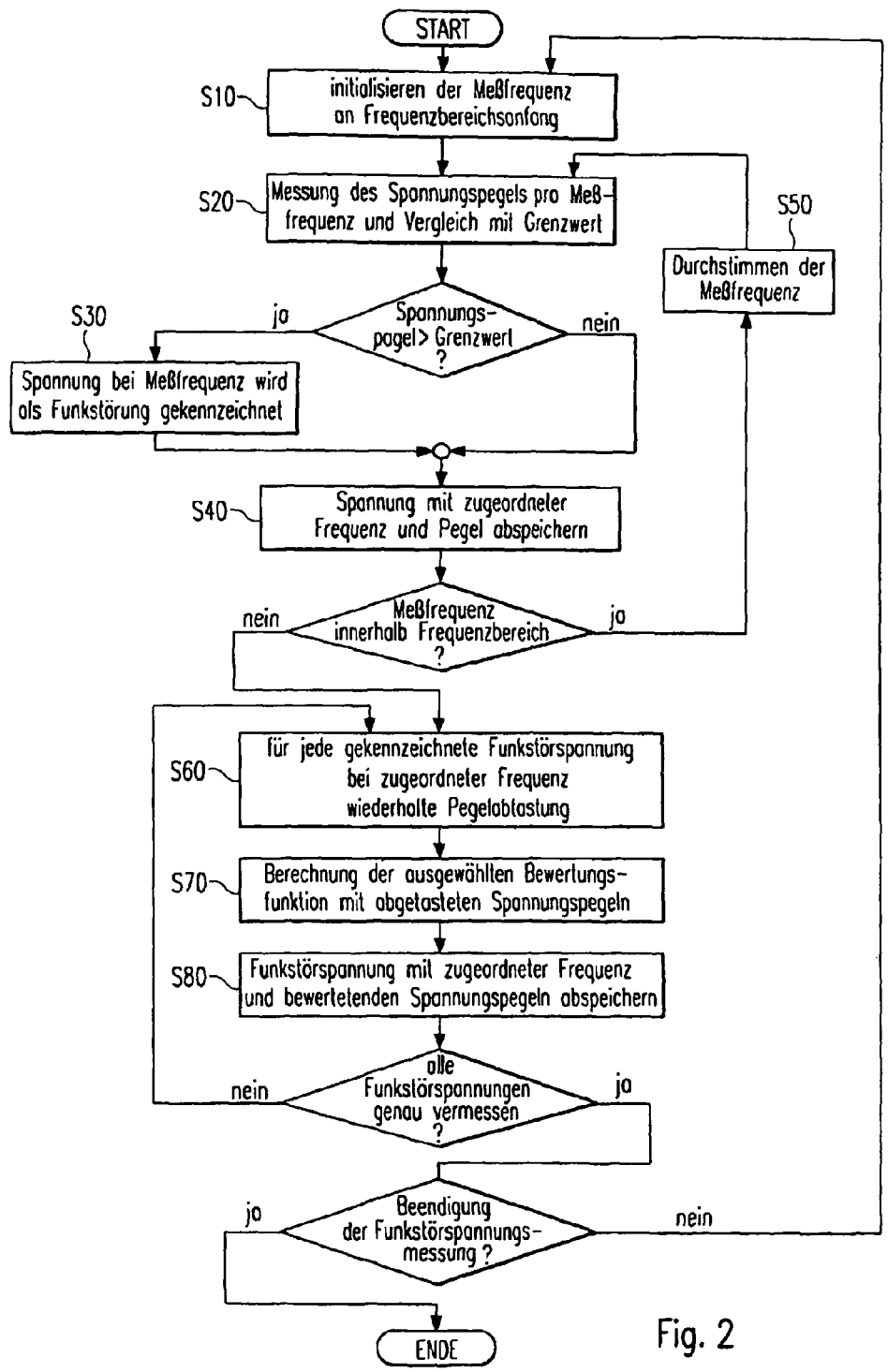
FIG. 2 shows a flow chart for the method according to the invention for measuring radio-interference voltages.
Figure 3:
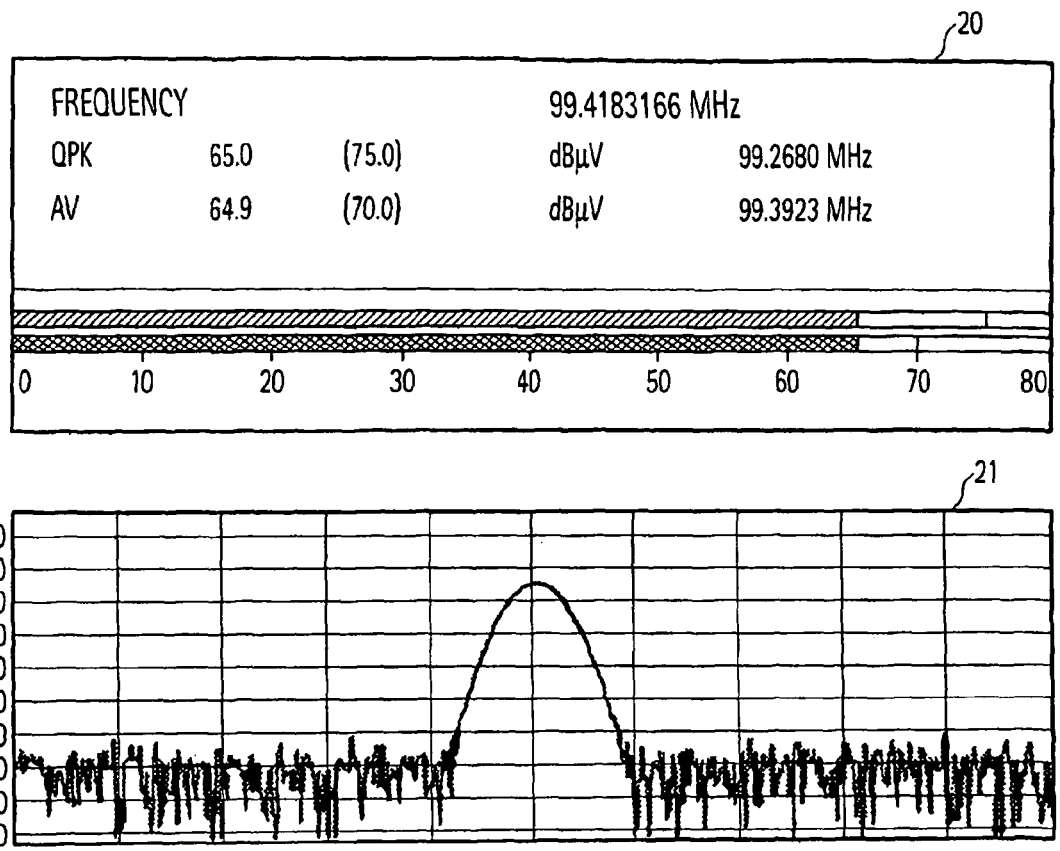
FIG. 3 shows a graphic representation of an exemplary result from the method according to the invention and/or from a device according to the invention for measuring radio-interference voltages.

The method according to the invention and respectively the device according to the invention for measuring radio-interference voltages are presented in FIGS. 1 to 3.

In this patent application, the terms radio-interference voltage and measuring voltage are used in the generally-applicable sense of radio-interference level and measuring level. This means not only voltage in the narrower sense as a measurement parameter but also refers to other measurement parameters, such as field strength, currents etc., which characterise the measurement signal. The terms voltage, measuring voltage, radio-interference voltage etc. can therefore be interchanged freely with level, measuring level or radio-interference level.

As shown in FIG. 1, any arbitrary useful signal and/or interference signal is received via an antenna 1 of the device according to the invention for measuring radio-interference voltages, which is positioned at a given, selectable measuring position. On the condition that the device according to the invention for measuring radio-interference voltages is positioned at a measuring position, at which no useful signals occur, only a noise signal will be received by the antenna 1 during undisturbed operation. Whenever radio interference occurs, this is received by a high-frequency unit 2 via the antenna 1.

Conversion to the intermediate frequency takes place in the subsequent first mixer 3. For this purpose, a first local oscillator 4, of which the frequency can be tuned, is adjusted over the entire measuring-frequency range of the device according to the invention, preferably using a specified, adjustable frequency grid. With this first local oscillator 4 adjusted with regard to a given frequency grid within the specified, measuring-frequency range, the frequency spectrum of the received high-frequency radio-interference voltage, together with the superimposed high-frequency noise voltage, is converted in the first mixer 3 into an intermediate-frequency range.

In the intermediate-frequency unit 5, various signal-processing functions (for example, filtering linearisation etc.) are implemented with the intermediate-frequency signal. The intermediate-frequency signal is converted into the baseband in the subsequent second mixer 6. The carrier frequency for the conversion into the baseband is generated by a second local oscillator 7 with a fixed frequency.

Undesirable high-frequency components, which are disposed outside the measuring-frequency range or outside any under-frequency ranges which may have been selected, are removed from the baseband signal in a subsequent low-pass filter 8. In the analog-digital converter, the analog measuring voltage is transformed into the digital data format. The absolute-number formation of the digitised, time-variable measuring voltage is implemented in the absolute-number former 10. The digitised, time-variable measuring voltage is logged in the log unit 11 to provide a semi-logarithmic presentation of the measured result.

Access to the signal is visualised through the symbolic switch 12. For this purpose, the switch 12 receives a control signal from a superordinate control unit 17, which determines the time of access. During the access, the digitised voltage level of the measuring voltage is registered in a detector 13.

The digitised voltage level of the measuring voltage registered with the detector 13 is read in by the microcomputer 14. The measuring voltage, consisting of the radio-interference voltage and the superimposed noise voltage, is measured, by means of the functional spectrum-analyser unit 15 of the microcomputer 14, over the entire adjustable measuring-frequency range in the adjustable frequency grid. For this purpose, the frequency of the first oscillator 4 is adjusted successively by the superordinate frequency and sampling control unit 17 of the microcomputer 14 over the adjustable measuring-frequency range within the adjustable frequency grid in order to record the frequency spectrum of the measuring voltage. The access to the digital measuring voltage, which is synchronous to the rate of frequency variation over the first measuring runtime, is also implemented by the superordinate frequency and sampling control unit 17. In the functional spectrum-analyser unit 15, the voltage level measured for each measuring frequency is compared with an adjustable limit value, and the measured voltage level is marked as the radio-interference voltage, if the limit value is exceeded by the measured voltage level. The voltage levels of the measured signal detected at the individual measuring frequencies within the measuring-frequency range, including the identified radio-interference voltage levels, are placed into intermediate storage in the memory 18.

After the measurement of the frequency spectrum of the measuring voltage over the entire measuring-frequency range has been completed by the functional spectrum-analyser unit 15, operation of the system is switched over to the functional measurement-receiver unit 16 by means of a superordinate process control unit integrated in the microcomputer 14, which is not, illustrated in FIG. 1. Within a measuring-frequency range of the functional measurement-receiver unit 16, which is generally smaller than the adjustable measuring-frequency range of the functional spectrum-analyser unit 15, a more accurate analysis of the runtime performance of the individual, identified radio-interference voltages over several access times is implemented in the functional measurement-receiver unit 16 within the framework of a second measuring runtime. The measurement and the evaluation results from the functional measurement-receiver unit 16 are also placed into intermediate storage in the memory 18.

All of the measurement results are displayed graphically in a presentation device 19, for example, a display, for visualisation and subsequent discussion of the results.

In the first procedural stage S10, in an initial pre-measurement, which is performed by the functional spectrum-analyser unit 15, the method according to the invention for measuring radio-interference voltages, of which the procedural stages are presented in the flow chart in FIG. 2, implements an initialisation of the measuring frequency of the device according to the invention as shown in FIG. 1, for example, with the lower frequency range selected by the user of the measuring-frequency range to be measured.

In the next procedural stage S20, the voltage level of the measuring voltage, consisting of the radio-interference voltage and superimposed noise voltage, is detected at the selected measuring frequency within a first measuring runtime. The respectively-measured voltage level is compared in procedural stage S20 with a limit value selected by the user. The limit value is conventionally a value, which is constant over the entire measuring-frequency range and which is placed over the entire measuring-frequency range as a marker. In principle, however, the use of a limit-value characteristic, which is variable over the entire measuring-frequency range, is also possible.

If the voltage level of the measuring voltage, measured at the respective measuring frequency, exceeds the limit value, the measuring voltage at this measuring frequency is marked as a radio-interference voltage, and the set measuring frequency is established as the mid-frequency for a subsequent post-measurement. If the limit value is exceeded by the measuring voltage over a given frequency range in the context of a broadband radio-interference voltage, the respective mean frequency is determined by the functional spectrum-analyser unit 15 and established as the mid-frequency.

In procedural stage S30, all of the voltages measured in procedural stage S20 at the individual measuring frequencies are stored together with their associated voltage levels and frequencies and, if the limit value is exceeded, with their mid-frequency and the marking as a radio-interference voltage.

If the value of the measuring frequency is below the upper limit frequency, selected by the user, of the measuring-frequency range to be measured, the measuring frequency is increased by one frequency-grid increment, and a new level measurement is implemented in procedural stage S20 with the new measuring frequency. Alternatively, a continuous measurement (sweep) can be implemented.

Once the set measuring frequency has reached the upper limit frequency of the measuring-frequency range selected by the user, the pre-measurement in the functional spectrum-analyser unit 15 is complete. The method now switches into the operating mode for the post-measurement, which is implemented by the functional measurement-receiver unit 16.

In procedural stage S60, in a second measuring runtime, which extends over a given, adjustable number of access times and is significantly longer than the first measuring runtime of the functional spectrum-analyser unit 15, the voltage level of the measuring voltage is measured for each of the radio-interference voltages marked in the pre-measurement by the functional spectrum-analyser unit 15. In this context, the measuring-frequency range of the functional measurement-receiver unit 16 is selected in such a manner that the mid-frequency determined by the functional spectrum-analyser unit 15 for each marked radio-interference voltage is used as the mid-frequency of the respective measuring-frequency range for the post-measurement. On the basis of the cyclical repetition of the post-measurement and the pre-measurement, the mid-frequency of the post-measurement is tracked to the mid-frequency of the marked radio-interference voltage identified in the pre-measurement, thereby allowing a dynamic measurement of a variable-frequency radio-interference voltage.

In the next procedural stage S70, a more accurate analysis of the runtime performance of the radio-interference voltage is implemented with a calculation function, selectable by the user, on the basis of the voltage levels of the measuring voltage measured at the individual access times. This analysis extends over the measuring-frequency range of the functional measurement-receiver unit 16 with the mid-frequency of the respective radio-interference voltage determined by the functional spectrum-analyser unit 15 as the mid-frequency of the measuring-frequency range. In this context, the following functions, by way of example, can be selected by the user as evaluation functions:

Sample function: identification of the momentary voltage level of the radio-interference voltage;
Max-peak function: identification of the maximum voltage level of the radio-interference voltage;
Min-peak function: identification of the minimum voltage level of the radio-interference voltage;
Quasi-peak function: evaluation, which evaluates the interference capacity of the signal;
Average function: linear averaging of the sampled voltage levels of the radio-interference voltage;
RMS function: quadratic averaging of the sampled voltage level of the radio-interference voltage.

In procedural stage S80, the voltage-level functional values determined by the respectively-selected evaluation functions for all of the measuring frequencies within the measuring-frequency range of the functional measurement-receiver unit 16 associated with the respective radio-interference voltage are stored as the results of a more accurate runtime analysis of the radio-interference voltage.

If all of the radio-interference voltages marked by the functional spectrum-analyser unit 15 have not yet been accurately measured by the functional measurement-receiver unit 16 in the context of the post-measurement, a more accurate measurement of the runtime performance for the next radio-interference voltage not yet measured in the post-measurement takes place in procedural stage S60 by setting the mid-frequency of the measuring-frequency range of the functional measurement-receiver unit 16 to the mid-frequency determined by the functional spectrum-analyser unit 15 of the radio-interference voltage to be measured subsequently, and a repeated sampling of the voltage levels of the radio-interference voltage to be measured is implemented within the set measuring-frequency range of the functional measurement-receiver unit 16.

When all of the radio-interference voltages marked by the functional spectrum-analyser unit 15 in the pre-measurement have been measured more accurately and analysed by the functional measurement-receiver unit 16 in the post-measurement, the method according to the invention for measuring radio-interference voltages is switched back by the superordinate process control unit to the pre-measurement by the functional spectrum-analyser unit 15, unless the user intends to quit the EMC measurement. In the pre-measurement, which is now repeated in procedural stage S10, the measuring frequency of the spectrum analyser is set to correspond to the lower limit frequency of the measuring-frequency range to be measured.

FIG. 3 shows an exemplary measuring result of a measurement of the radio-interference voltage as presented on a display device 19. In the upper region 20 of the display, which is reserved for the results of the post-measurement, the voltage level values and frequency values are presented as an evaluation using the quasi peak and average function with a determined mid-frequency, in the example, approximately 99.4 MHz, for an identified radio-interference voltage. In the lower range 21 of the display, the frequency spectrum of the radio-interference voltage, including the adjacent noise voltage in the measuring-frequency range of the functional spectrum-analyser unit 15 with the determined mid-frequency of the radio-interference voltage, is presented as the mid-frequency of the measuring-frequency range used. The results of the pre-measurement and post-measurement can be presented in a similar manner for the remaining identified radio-interference voltages. The spectral characteristic of the evaluation function, in the example, the quasi-peak and average functions, can additionally be presented in the lower region 21.

The essential point is that a frequency adjustment takes place with every post-measurement. In the context of a post-measurement, a new maximum value is stored and/or the previously-stored maximum value is overwritten, if it is greater than all previously-registered maximum values. The frequency value associated with this new maximum value is also stored.

The invention is not restricted to the exemplary embodiment described. Any of the functions and elements described can be combined with one another as required.

The invention claimed is:

1. A method for measuring radio-interference levels within a given frequency range, the method comprising:
   a pre-measurement stage comprising:
      selecting a frequency range;
      detecting for each measuring frequency in said frequency range a measuring level of a signal,
      comparing each of said measuring levels to a limit value; and
      marking said measuring level as a radio-interference level if said step of comparing indicates said measuring level is above said limit-value;
   a post-measurement stage comprising:
      detecting a frequency drift mid-frequency of a frequency range for post-measurement by tracking each marked radio-interference level to the mean frequency of said radio-interference levels marked in the immediately prior pre-measurement stage; and
      measuring said radio interference levels; and
   cyclically repeating said pre-measurement and said post-measurement stages in alternation.

2. The method of claim 1 wherein said measuring level of each radio-interference level is determined in each pre-measurement stage.

3. The method of claim 2 wherein said frequency range is adjusted within a preselected frequency grid.

4. The method of claim 2 wherein in said step of measuring, said radio-interference level is measured several times repeatedly by comparison with said measuring level.

5. The method of claim 4 further comprising the step of determining a level according to a statistical evaluation method for each radio-interference level which was measured several times repeatedly.

6. The method of claim 1 wherein said frequency range is adjusted within a preselected frequency grid.

7. The method of claim 6 wherein in said step of measuring, said radio-interference level is measured several times repeatedly by comparison with said measuring level.

8. The method of claim 7 further comprising the step of determining a level according to a statistical evaluation method for each radio-interference level which was measured several times repeatedly.

9. The method of claim 1 wherein in said step of measuring, said radio-interference level is measured several times repeatedly by comparison with said measuring level.

10. The method of claim 9 further comprising the step of determining a level according to a statistical evaluation method for each radio-interference level which was measured several times repeatedly.

11. A device for measuring radio-interference levels within a given frequency range comprising:
   a micro-computer including:
      functional spectrum-analyzer means for identifying radio-interference levels and determining a mean frequency of said radio-interference levels; and
      functional measurement-receiver means for:
         multiply measuring of each of said radio interference levels; and
         statistical evaluation of the multiply measured levels;
   wherein said micro-computer;
   performs a pre-measurement stage comprising:
      selecting a frequency range;
      detecting for each measuring frequency in said frequency range a measuring level of a signal,
      comparing each of said measuring levels to a limit value; and
      marking said measuring level as a radio-interference level if said step of comparing indicates said measuring level is above said limit-value;
   performs a post-measurement stage comprising:
      detecting a frequency drift mid-frequency of a frequency range for post-measurement by tracking each marked radio-interference level to the mean frequency of said radio-interference levels marked in the immediately prior pre-measurement stage; and
      measuring said radio interference levels; and
   cyclically repeats said pre-measurement and said post-measurement stages in alternation.

* * * * *